US012702067B2

(12) United States Patent
Chang

(10) Patent No.: US 12,702,067 B2
(45) Date of Patent: Aug. 4, 2026

---

(54) SEMICONDUCTOR PACKAGE

(71) Applicant: SAMSUNG ELECTRONICS CO., LTD., Suwon-si (KR)

(72) Inventor: Gunho Chang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 499 days.

(21) Appl. No.: 18/195,536

(22) Filed: May 10, 2023

(65) Prior Publication Data

US 2024/0055413 A1 Feb. 15, 2024

(30) Foreign Application Priority Data

Aug. 10, 2022 (KR) ........................ 10-2022-0100089
Sep. 7, 2022 (KR) ........................ 10-2022-0113295

(51) Int. Cl.
| | |
|---|---|
| *H10W 90/00* | (2026.01) |
| *H10B 80/00* | (2026.01) |
| *H10W 70/60* | (2026.01) |
| *H10W 70/63* | (2026.01) |
| *H10W 72/00* | (2026.01) |

(Continued)

(52) U.S. Cl.
CPC ............ *H10W 90/00* (2026.01); *H10B 80/00* (2023.02); *H10W 70/611* (2026.01); *H10W 70/635* (2026.01); *H10W 72/07252* (2026.01); *H10W 74/111* (2026.01); *H10W 72/07353* (2026.01); *H10W 72/227* (2026.01); *H10W 72/334* (2026.01); *H10W 72/337* (2026.01); *H10W 74/15* (2026.01); *H10W 90/722* (2026.01);

(Continued)

(58) Field of Classification Search
CPC .............. H01L 25/105; H01L 23/3107; H01L 23/349827; H01L 23/5384; H01L 24/16; H01L 24/17; H01L 24/32; H01L 24/33; H01L 24/73; H10B 00/00
USPC ......................................................... 257/777
See application file for complete search history.

(56) References Cited

U.S. PATENT DOCUMENTS

| | | |
|---|---|---|
| 9,397,078 B1 | 7/2016 | Chandolu et al. |
| 9,640,521 B2 | 5/2017 | Chang et al. |

(Continued)

FOREIGN PATENT DOCUMENTS

| | | |
|---|---|---|
| KR | 10-2008-0065871 A | 7/2008 |
| KR | 10-2019-0087897 A | 7/2019 |

(Continued)

*Primary Examiner* — Jasmine J Clark
(74) *Attorney, Agent, or Firm* — Sughrue Mion, PLLC

(57) ABSTRACT

A semiconductor package includes a first semiconductor chip, a chip stack on the first semiconductor chip, and a mold layer enclosing the chip stack, on the first semiconductor chip. The chip stack includes second semiconductor chips vertically stacked on the first semiconductor chip, a third semiconductor chip on the second semiconductor chips, and non-conductive layers filling spaces between adjacent ones of the second semiconductor chips. The mold layer fills spaces between the first semiconductor chip and the chip stack, which are spaced apart from each other by a first distance, and between the uppermost one of the second semiconductor chips and the third semiconductor chip, which are spaced apart from each other by a second distance. The second semiconductor chips are spaced apart from each other by a third distance that is smaller than the first distance and the second distance.

20 Claims, 12 Drawing Sheets

(51) Int. Cl.

| | | |
|---|---|---|
| *H10W 72/20* | (2026.01) | |
| *H10W 72/30* | (2026.01) | |
| *H10W 74/10* | (2026.01) | |
| *H10W 74/15* | (2026.01) | |

(52) U.S. Cl.
CPC ........ *H10W 90/724* (2026.01); *H10W 90/732* (2026.01); *H10W 90/734* (2026.01)

(56) References Cited

U.S. PATENT DOCUMENTS

| 9,721,926 B2* | 8/2017 | Choe | H01L 23/481 |
|---|---|---|---|
| 9,991,234 B2 | 6/2018 | Seo et al. | |
| 10,658,300 B2 | 5/2020 | Kim et al. | |
| 2018/0286835 A1 | 10/2018 | Nah | |
| 2021/0159178 A1 | 5/2021 | Nam et al. | |
| 2022/0173076 A1* | 6/2022 | Kim | H01L 21/561 |
| 2024/0021581 A1* | 1/2024 | Ko | H01L 23/3107 |

FOREIGN PATENT DOCUMENTS

| KR | 10-2019-0136459 A | 12/2019 |
|---|---|---|
| KR | 10-2022-0101335 A | 7/2022 |
| KR | 10-2022-0109936 A | 8/2022 |

* cited by examiner

FIG. 12

SEMICONDUCTOR PACKAGE

CROSS-REFERENCE TO RELATED APPLICATIONS

This application claims priority to Korean Patent Application Nos. 10-2022-0100089 and 10-2022-0113295, filed on Aug. 10, 2022 and Sep. 7, 2022, respectively, in the Korean Intellectual Property Office, the entire contents of which are hereby incorporated by reference.

BACKGROUND

The disclosure relates to a semiconductor package, and in particular, to a semiconductor package, in which a plurality of semiconductor chips are stacked.

With recent advances in the electronics industry, demand for high-performance, high-speed, and compact electronic components are increasing. To meet this demand, packaging technologies of mounting a plurality of semiconductor chips in a single package are being developed.

Recently, demand for portable electronic devices has been rapidly increasing in the market, and thus, it is necessary to reduce sizes and weights of electronic components constituting the portable electronic devices. For this, it is necessary to develop packaging technologies of reducing a size and a weight of each component and of integrating a plurality of individual components in a single package. Here, a plurality of adhesive members are used to attach the components to each other, but the increase of the number of the adhesive members leads to various technical problems.

SUMMARY

A semiconductor package is disclosed with improved structural stability.

A highly-reliable semiconductor package is disclosed.

In accordance with an aspect of the disclosure, a semiconductor package includes a first semiconductor chip; a chip stack on the first semiconductor chip; and a mold layer enclosing the chip stack, on the first semiconductor chip, wherein the chip stack includes second semiconductor chips vertically stacked on the first semiconductor chip; a third semiconductor chip on the second semiconductor chips; and non-conductive layers filling spaces between adjacent ones of the second semiconductor chips, wherein the mold layer fills a space between the first semiconductor chip and the chip stack and the mold layer fills a space between an uppermost one of the second semiconductor chips and the third semiconductor chip, wherein the first semiconductor chip and the chip stack are spaced apart from each other by a first distance, wherein the uppermost one of the second semiconductor chips and the third semiconductor chip are spaced apart from each other by a second distance, and wherein the second semiconductor chips are spaced apart from each other by a third distance that is smaller than the first distance and the second distance.

In accordance with an aspect of the disclosure, a semiconductor package includes a semiconductor substrate; substrate connection terminals on a bottom surface of the semiconductor substrate; lower semiconductor chips vertically stacked on the semiconductor substrate; non-conductive layers filling spaces between adjacent ones of the lower semiconductor chips; an upper semiconductor chip on the lower semiconductor chips; and a mold layer enclosing the lower semiconductor chips, the non-conductive layers, and the upper semiconductor chip, on the semiconductor substrate, wherein the mold layer fills a space between the upper semiconductor chip and an uppermost one of the lower semiconductor chips, wherein each of the non-conductive layers protrudes to a region on a side surface of an adjacent lower semiconductor chip of the lower semiconductor chips and is spaced apart from the upper semiconductor chip, and wherein the non-conductive layers include a material different from a material of the mold layer.

In accordance with an aspect of the disclosure, a semiconductor package includes a first semiconductor chip; substrate connection terminals on a bottom surface of the first semiconductor chip; second semiconductor chips stacked on the first semiconductor chip; non-conductive layers between adjacent ones of the second semiconductor chips; a third semiconductor chip on the second semiconductor chips; connection terminals between adjacent ones of the first semiconductor chip, the second semiconductor chips, and the third semiconductor chip; penetration electrodes penetrating each of the first semiconductor chip and the second semiconductor chips and coupled to the connection terminals; and a mold layer enclosing the second semiconductor chips, the third semiconductor chip, and the non-conductive layers, on the first semiconductor chip, wherein the mold layer fills a space between the first semiconductor chip and a lowermost one of the second semiconductor chips and a space between the third semiconductor chip and an uppermost one of the second semiconductor chips, wherein each of the non-conductive layers includes a protruding portion that is extended to a region on a side surface of an adjacent second semiconductor chip of the second semiconductor chips, and wherein each of the non-conductive layers is spaced apart from at least one of the first semiconductor chip and the third semiconductor chip.

BRIEF DESCRIPTION OF DRAWINGS

FIGS. 11 and 12 are sectional views each illustrating a semiconductor package according to an embodiment.

DETAILED DESCRIPTION

Example embodiments will now be described more fully with reference to the accompanying drawings, in which example embodiments are shown.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present. Like numerals refer to like elements throughout.

Spatially relative terms, such as "over," "above," "on," "upper," "below," "under," "beneath," "lower," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

As used herein, expressions such as "at least one of" when preceding a list of elements, modify the entire list of elements and do not modify the individual elements of the list. For example, the expression, "at least one of a, b, and c" should be understood as including only a, only b, only c, both a and b, both a and c, both b and c, or all of a, b, and c.

For the sake of brevity, conventional elements to semiconductor devices may or may not be described in detail herein for brevity purposes.

Figure 1:
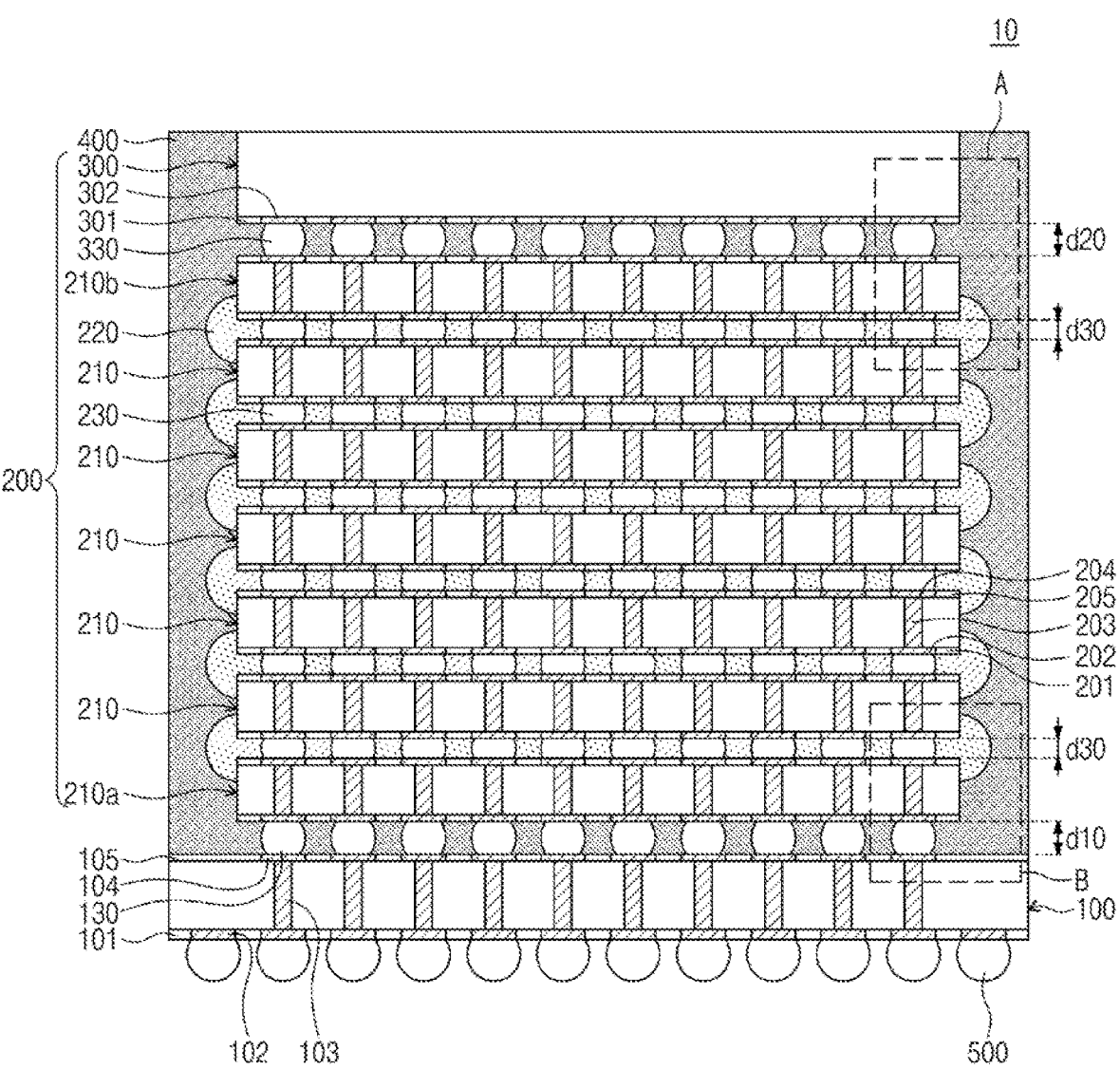
FIG. 1 is a sectional view illustrating a semiconductor package according to an embodiment.
Figure 2:
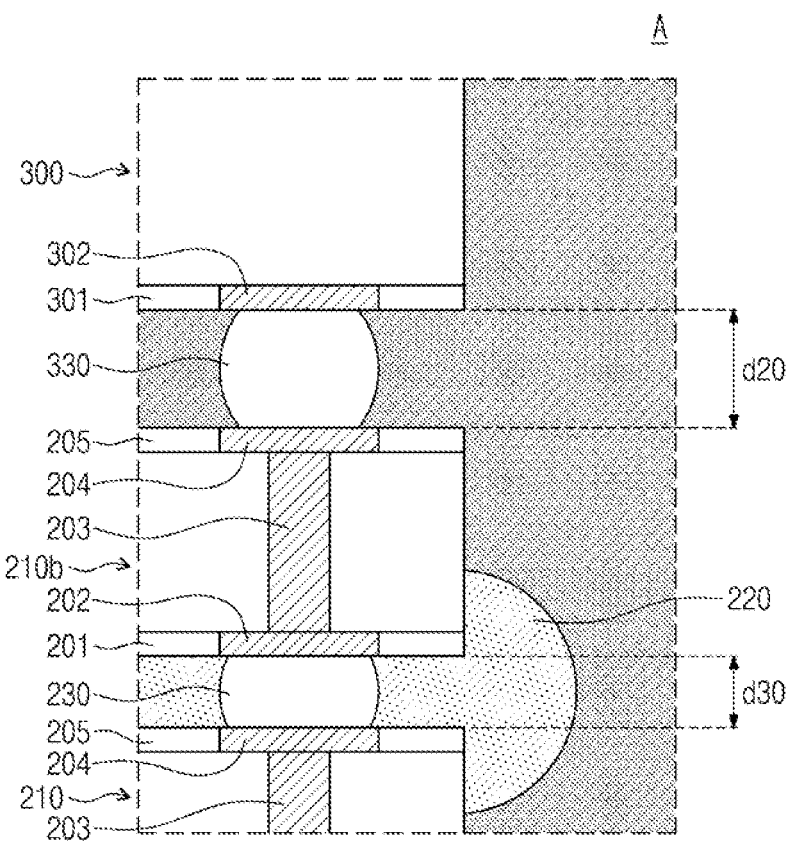
FIG. 2 is an enlarged sectional view illustrating a portion A of FIG. 1.
Figure 3:
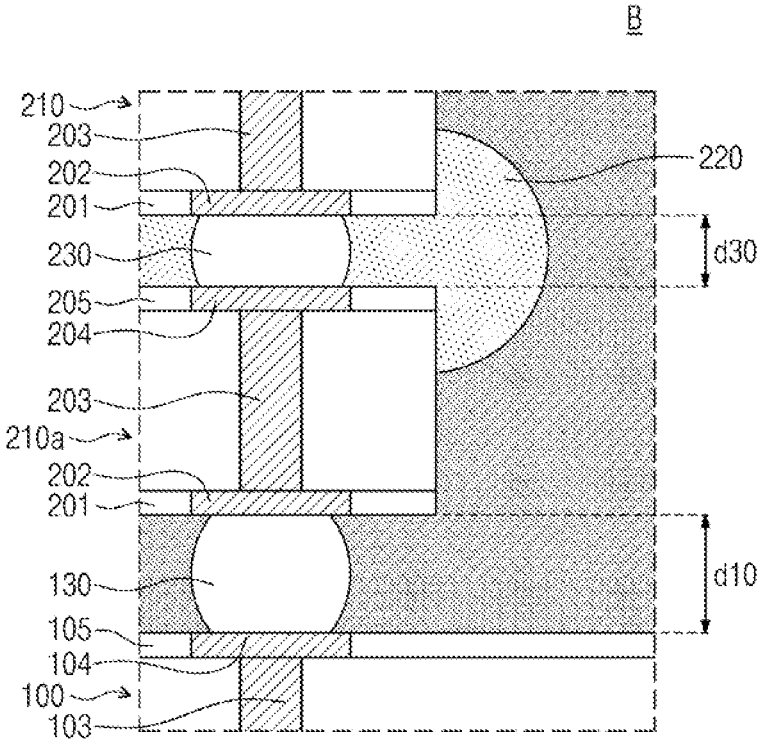
FIG. 3 is an enlarged sectional view illustrating a portion B of FIG. 1.

FIG. 1 is a sectional view illustrating a semiconductor package according to an embodiment. FIG. 2 is an enlarged sectional view illustrating a portion A of FIG. 1. FIG. 3 is an enlarged sectional view illustrating a portion B of FIG. 1.

Referring to FIGS. 1 to 3, a chip stack package 10 may include a first semiconductor chip 100, a chip stack 200, a mold layer 400, and substrate connection terminals 500.

In an embodiment, the first semiconductor chip 100 may include a semiconductor substrate, on which a plurality of semiconductor chips are stacked. The first semiconductor chip 100 may include a logic chip, a controller chip, or a buffer chip. However, the disclosure is not limited to this example, and the first semiconductor chip 100 may be a printed circuit board (PCB).

The first semiconductor chip 100 may include a first circuit layer 101, a first lower pad 102, a first penetration electrode 103, a first insulating layer 105, and a first upper pad 104.

The first circuit layer 101 may be provided on a bottom surface of the first semiconductor chip 100. The first circuit layer 101 may include an integrated circuit. For example, the first circuit layer 101 may include a logic circuit. The bottom surface of the first semiconductor chip 100, on which the first circuit layer 101 is provided, may be an active surface. The first circuit layer 101 may include any one or more of an electronic element (e.g., a transistor), an insulating pattern, and an interconnection pattern.

The first lower pad 102 may be disposed on the bottom surface of the first semiconductor chip 100. For example, the first lower pad 102 may be exposed to the outside of the first circuit layer 101 near a bottom surface of the first circuit layer 101. A bottom surface of the first lower pad 102 may be coplanar with the bottom surface of the first circuit layer 101. The first lower pad 102 may be electrically connected to the integrated circuit of the first circuit layer 101. In the present specification, the expression "electrically connected or coupled" may mean that a plurality of elements are directly connected/coupled to each other or are indirectly connected or coupled to each other via another conductive element. The expression "an element is electrically connected to a semiconductor chip" may mean that the element is electrically connected to integrated circuits of the semiconductor chip. In an embodiment, a plurality of first lower pads 102 may be provided. The first lower pads 102 may be formed of or include at least one of metallic materials (e.g., copper (Cu), aluminum (Au), and/or nickel (Ni)).

The first penetration electrode 103 may be provided in the first semiconductor chip 100. The first penetration electrode 103 may be provided to vertically penetrate the first semiconductor chip 100. The first penetration electrode 103 may be electrically connected to the first circuit layer 101. In an embodiment, a plurality of first penetration electrodes 103 may be provided. The first penetration electrodes 103 may be laterally spaced apart from each other. In an embodiment, the first penetration electrodes 103 may be formed of or include at least one of metallic materials (e.g., copper (Cu), titanium (Ti), tungsten (W), and/or combinations thereof).

The first upper pad 104 may be disposed on a top surface of the first semiconductor chip 100. In an embodiment, a plurality of first upper pads 104 may be provided. Each of the first upper pads 104 may be coupled to a corresponding one of the first penetration electrodes 103. In other words, the first penetration electrodes 103 may be provided to vertically penetrate the first semiconductor chip 100 and may be coupled to bottom surfaces of the first upper pads 104. The first upper pads 104 may be coupled to the first circuit layer 101 by way of the first penetration electrodes 103. The first upper pads 104 may be electrically connected to the first lower pads 102 by way of the first penetration electrodes 103 and the first circuit layer 101. The first upper pads 104 may be formed of or include at least one of metallic materials (e.g., copper (Cu), aluminum (Au), and/or nickel (Ni)).

The first insulating layer 105 may enclose the first upper pads 104, on the top surface of the first semiconductor chip 100. A top surface of the first insulating layer 105 may be coplanar with top surfaces of the first upper pads 104. The first insulating layer 105 may be a layer that is used to protect the first semiconductor chip 100. The first insulating layer 105 may be formed of or include at least one of silicon oxide (SiO), silicon nitride (SiN), silicon oxynitride (SiON), or silicon carbon nitride (SiCN).

The first semiconductor chip 100 may further include a lower protection layer provided on a bottom surface thereof. The lower protection layer may be provided to cover the first circuit layer 101 and to expose the first lower pads 102. The lower protection layer may be formed of or include at least one of silicon oxide (SiO), silicon nitride (SiN), silicon oxynitride (SiON), or silicon carbon nitride (SiCN).

The substrate connection terminal 500 may be provided on the bottom surface of the first semiconductor chip 100. In an embodiment, a plurality of substrate connection terminals 500 may be provided. The substrate connection terminals 500 may be provided on bottom surfaces of the first lower pads 102. The substrate connection terminals 500 may be electrically connected to the first circuit layer 101 and the first penetration electrodes 103 by way of the first lower pads 102. The substrate connection terminals 500 may be formed of or include at least one of alloys containing one of tin (Sn), silver (Ag), copper (Cu), nickel (Ni), bismuth (Bi), indium (In), antimony (Sb), cerium (Ce), or combinations thereof.

The chip stack 200 may be disposed on the first semiconductor chip 100. The chip stack 200 may include second semiconductor chips 210, a third semiconductor chip 300, non-conductive layers 220, and second connection terminals 230.

The chip stack 200 may be spaced apart from the first semiconductor chip 100 by a first distance d10. In more detail, the first distance d10 may be a distance between the first semiconductor chip 100 and a second semiconductor chip 210a, which is the lowermost semiconductor chip of the second semiconductor chips 210. The first distance d10 may range from 10 μm to 50 μm.

The second semiconductor chips 210 may be stacked on the first semiconductor chip 100 in a direction perpendicular to the top surface of the first semiconductor chip 100. The second semiconductor chips 210 may be sequentially stacked but may be spaced apart from each other by a third distance d30. The third distance d30 may be smaller than the first distance d10. The third distance d30 may range from 5 μm to 20 μm.

The second semiconductor chips 210 may have substantially the same width. Side surfaces of the second semiconductor chips 210 may be vertically aligned to each other. The width of the second semiconductor chips 210 may be smaller than a width of the first semiconductor chip 100. However, the disclosure is not limited to this example, and the widths of and the distances between the second semiconductor chips 210 may be different from each other. If elements are described to have the same thickness, size, level, and width, each element may be provided to have a thickness, size, level, and width within a specific process tolerance.

The second semiconductor chips 210 may be a semiconductor chip that is of a kind different from the first semiconductor chip 100. For example, the second semiconductor chips 210 may include a memory chip.

Hereinafter, the structure of the second semiconductor chips 210 will be described, based on one of the second semiconductor chips 210.

A second circuit layer 201 may be provided on a bottom surface of the second semiconductor chip 210. The second circuit layer 201 may include an integrated circuit. For example, the second circuit layer 201 may include a memory circuit. The bottom surface of the second semiconductor chip 210, on which the second circuit layer 201 is provided, may be an active surface. The second circuit layer 201 may include an electronic element (e.g., a transistor), an insulating pattern, and an interconnection pattern.

A second lower pad 202 may be disposed on the bottom surface of the second semiconductor chip 210. For example, the second lower pad 202 may be exposed to the outside of the second circuit layer 201 near a bottom surface of the second circuit layer 201. A bottom surface of the second lower pad 202 may be coplanar with the bottom surface of the second circuit layer 201. The second lower pad 202 may be electrically connected to the second circuit layer 201. In an embodiment, a plurality of second lower pads 202 may be provided. The second lower pads 202 may be formed of or include at least one of metallic materials (e.g., copper (Cu), aluminum (Au), and/or nickel (Ni)).

A second penetration electrode 203 may be provided in the second semiconductor chips 210. The second penetration electrode 203 may be provided to vertically penetrate the second semiconductor chip 210. The second penetration electrode 203 may be electrically connected to the second circuit layer 201. In an embodiment, a plurality of second penetration electrodes 203 may be provided. The second penetration electrodes 203 may be laterally spaced apart from each other. The second penetration electrodes 203 may be formed of or include at least one of metallic materials (e.g., copper (Cu), titanium (Ti), tungsten (W), and/or combinations thereof).

A second upper pad 204 may be disposed on a top surface of the second semiconductor chip 210. In an embodiment, a plurality of second upper pads 204 may be provided. Each of the second upper pads 204 may be coupled to a corresponding one of the second penetration electrodes 203. In other words, the second penetration electrodes 203 may be provided to vertically penetrate the second semiconductor chip 210 and may be coupled to bottom surfaces of the second upper pads 204. The second upper pads 204 may be coupled to the second circuit layer 201 by way of the second penetration electrodes 203. The second upper pads 204 may be electrically connected to the second lower pads 202 by way of the second penetration electrodes 203 and the second circuit layer 201. The second upper pads 204 may be formed of or include at least one of metallic materials (e.g., copper (Cu), aluminum (Au), and/or nickel (Ni)).

A second insulating layer 205 may enclose the second upper pads 204, on the top surface of the second semiconductor chip 210. A top surface of the second insulating layer 205 may be coplanar with top surfaces of the second upper pads 204. The second insulating layer 205 may be a layer that is used to protect the second semiconductor chip 210. The second insulating layer 205 may be formed of or include at least one of silicon oxide (SiO), silicon nitride (SiN), silicon oxynitride (SiON), or silicon carbon nitride (SiCN).

The second connection terminals 230 may be disposed between the second semiconductor chips 210 to be spaced apart from each other. Each of the second connection terminals 230 may be disposed between a corresponding pair of the second lower and upper pads 202 and 204. The second semiconductor chips 210 may be electrically connected to each other by the second connection terminals 230. For example, two adjacent ones of the second semiconductor chips 210 may be electrically connected to each other by the second connection terminals 230. The second connection terminals 230 may be solder balls or solder bumps, which are formed of an alloy containing at least one of tin (Sn), silver (Ag), copper (Cu), nickel (Ni), bismuth (Bi), indium (In), antimony (Sb), or cerium (Ce).

The third semiconductor chip 300 may be disposed on the second semiconductor chips 210. In more detail, the third semiconductor chip 300 may be stacked on a second semiconductor chip 210b, which is the uppermost semiconductor chip of the second semiconductor chips 210. That is, the third semiconductor chip 300 may be a semiconductor chip, which is provided at the uppermost level of the chip stack 200. The third semiconductor chip 300 may be spaced apart from the uppermost second semiconductor chip 210b by a second distance d20. The second distance d20 may be substantially equal to the first distance d10. In an embodiment, the second distance d20 may be larger than the first distance d10. The second distance d20 may be larger than the third distance d30. The second distance d20 may range from 10 μm to 50 μm.

The third semiconductor chip 300 may be a semiconductor chip that is of a kind different from the first semiconductor chip 100. The third semiconductor chip 300 may be a semiconductor chip that is of the same kind as the second semiconductor chips 210. The third semiconductor chip 300 may include a memory chip.

A width of the third semiconductor chip 300 may be substantially equal to the widths of the second semiconductor chips 210. A side surface of the third semiconductor chip 300 may be vertically aligned to side surfaces of the second semiconductor chips 210. The width of the third semiconductor chip 300 may be smaller than the width of the first semiconductor chip 100. A thickness of the third semiconductor chip 300 may be larger than a thickness of each of the first semiconductor chip 100 and the second semiconductor chips 210.

The third semiconductor chip 300 may include a third circuit layer 301 and a third lower pad 302.

The third circuit layer 301 may be provided on a bottom surface of the third semiconductor chip 300. The third circuit layer 301 may include an integrated circuit. For example, the third circuit layer 301 may include a memory circuit. The bottom surface of the third semiconductor chip 300, on which the third circuit layer 301 is provided, may be an active surface. The third circuit layer 301 may include an electronic element (e.g., a transistor), an insulating pattern, and an interconnection pattern.

The third lower pad 302 may be disposed on the bottom surface of the third semiconductor chip 300. For example, the third lower pad 302 may be exposed to the outside of the third circuit layer 301 near a bottom surface of the third circuit layer 301. A bottom surface of the third lower pad 302 may be coplanar with the bottom surface of the third circuit layer 301. The third lower pad 302 may be electrically connected to the third circuit layer 301. In an embodiment, a plurality of third lower pads 302 may be provided. The third lower pads 302 may be formed of or include at least one of metallic materials (e.g., copper (Cu), aluminum (Au), and/or nickel (Ni)).

The third semiconductor chip 300 may be electrically connected to the uppermost second semiconductor chip 210b by way of third connection terminals 330, which are provided between the third semiconductor chip 300 and the uppermost second semiconductor chip 210b. In more detail, the third lower pads 302 of the third semiconductor chip 300 and the second upper pads 204 of the uppermost second semiconductor chip 210b may be directly connected to each other by the third connection terminals 330. The third connection terminals 330 may be solder balls or solder bumps, which are formed of an alloy containing at least one of tin (Sn), silver (Ag), copper (Cu), nickel (Ni), bismuth (Bi), indium (In), antimony (Sb), or cerium (Ce).

The non-conductive layers 220 may be provided to fill spaces between the second semiconductor chips 210. The non-conductive layers 220 may be provided to enclose the second connection terminals 230, between the second semiconductor chips 210. The non-conductive layers 220 may have protruding portions which are extended to regions on the side surfaces of the second semiconductor chips 210. The protruding portion may cover at least a portion of the side surface of the second semiconductor chips 210. The non-conductive layer may not be provided between the first semiconductor chip 100 and the lowermost second semiconductor chip 210a. The non-conductive layers 220 may be spaced apart from the first semiconductor chip 100. In other words, the non-conductive layers 220 may not be in contact with the first semiconductor chip 100. The non-conductive layer may not be provided between the third semiconductor chip 300 and the uppermost second semiconductor chip 210b. The non-conductive layers 220 may be spaced apart from the third semiconductor chip 300. In other words, the non-conductive layers 220 may not be in contact with the third semiconductor chip 300. The non-conductive layers

220, which are provided between the second semiconductor chips 210, are illustrated to be spaced apart from each other, but the disclosure is not limited to this example; for example, the non-conductive layers 220 between the second semiconductor chips 210 may be connected to each other. The non-conductive layers 220 may include a non-conductive film (NCF) or a non-conductive paste (NCP). The non-conductive layers 220 may include an insulating polymer. For example, the non-conductive layers 220 may be formed of or include an epoxy-based material, which does not contain any conductive particle. In this case, it may be possible to reduce a pitch of the second connection terminals 230 without an electric short circuit issue between adjacent ones of the second connection terminals 230. In addition, since each of the non-conductive layers 220 serves as an under-filler filling a space between the second semiconductor chips 210, the mechanical durability of the second connection terminals 230 may be improved.

The chip stack 200 may be mounted on the first semiconductor chip 100. The chip stack 200 may be electrically connected to the first semiconductor chip 100 by first connection terminals 130, which are provided between the chip stack 200 and the first semiconductor chip 100. In more detail, the second lower pads 202 of the lowermost second semiconductor chip 210a and the first upper pads 104 of the first semiconductor chip 100 may be directly connected to each other by the first connection terminals 130. The first connection terminals 130 may be solder balls or solder bumps, which are formed of an alloy containing at least one of tin (Sn), silver (Ag), copper (Cu), nickel (Ni), bismuth (Bi), indium (In), antimony (Sb), or cerium (Ce).

The mold layer 400 may be provided on the first semiconductor chip 100. The mold layer 400 may cover the top surface of the first semiconductor chip 100. A side surface of the mold layer 400 may be vertically aligned to a side surface of the first semiconductor chip 100. The mold layer 400 may enclose the chip stack 200. In other words, the mold layer 400 may be provided to enclose all of the second semiconductor chips 210, the third semiconductor chip 300, and the non-conductive layers 220. The mold layer 400 may expose a top surface of the chip stack 200 (i.e., a top surface of the third semiconductor chip 300). As an example, a top surface of the mold layer 400 may be disposed at substantially the same level as the top surface of the third semiconductor chip 300. Alternatively, the mold layer 400 may be provided to cover the top surface of the third semiconductor chip 300. The mold layer 400 may be in contact with the protruding portions of the non-conductive layers 220 and portions of the side surfaces of the second semiconductor chips 210, which are not covered by the non-conductive layers 220. The mold layer 400 may not be provided between the second semiconductor chips 210. An outer side surface of the mold layer 400 may be spaced apart from the non-conductive layers 220.

The mold layer 400 may fill a region between the first semiconductor chip 100 and the chip stack 200. The mold layer 400 may enclose the first connection terminals 130, between the first semiconductor chip 100 and the lowermost second semiconductor chip 210a. The mold layer 400 may fill a region between the third semiconductor chip 300 and the uppermost second semiconductor chip 210b. The mold layer 400 may enclose the third connection terminals 330, between the third semiconductor chip 300 and the uppermost second semiconductor chip 210b. In an embodiment, the mold layer 400 may be formed of or include an epoxy molding compound (EMC). The mold layer 400 may be formed of or include a material different from a material of the non-conductive layers 220.

According to an embodiment of the disclosure, the chip stack package 10 may be a stack-type semiconductor package, in which a plurality of semiconductor chips 100, 210, and 300 are stacked. The chip stack package 10 may include a high bandwidth memory (HBM). The semiconductor chips 100, 210, and 300 may be electrically connected to each other by way of the connection terminals 130, 230, and 330 and the penetration electrodes 103 and 203. Although the chip stack package 10 is illustrated in FIG. 1 to have a structure in which eight semiconductor chips are stacked on the first semiconductor chip 100, the disclosure is not limited to this example. The number of the semiconductor chips disposed on the first semiconductor chip 100 may be variously changed and may be, for example, 4n, where n is a natural number that is greater than or equal to one. The more the stacked semiconductor chips, the larger the memory capacity of the chip stack package 10.

In the case where the non-conductive layer 220 is provided between each pair of the semiconductor chips (e.g., 100, 210, and 300) constituting the semiconductor package, the non-conductive layer 220, which is provided between the first semiconductor chip 100 and the chip stack 200, may be formed to have a protruding portion that is larger than the protruding portions of the non-conductive layers 220 provided between the second semiconductor chips. In this case, the protruding portion may undesirably protrude from the side surface of the mold layer 400 in a process of manufacturing a semiconductor package. Furthermore, in the case where a non-conductive layer is provided between the third semiconductor chip 300 and the uppermost second semiconductor chip 210b, the non-conductive layer may protrude from the top surface of the third semiconductor chip 300 in an upward direction, and this may lead to a failure in the process of manufacturing a semiconductor package.

By contrast, according to an embodiment of the disclosure, the non-conductive layer may not be provided in a region between the first semiconductor chip 100 and the chip stack 200 and in a region between the third semiconductor chip 300 and the uppermost second semiconductor chip 210b, and the mold layer 400 may be provided to fill these regions. Accordingly, it may be possible to prevent the failure, which may be caused by the non-conductive layer. Furthermore, it may be possible to reduce the number of the non-conductive layers 220 provided in the chip stack package 10 and thereby to suppress a warpage issue, which is caused by the non-conductive layers 220 that are formed of a material having a high thermal expansion coefficient. That is, the chip stack package 10 may be manufactured to have high structural stability.

In the following description, an element previously described with reference to FIGS. 1 to 3 may be identified by the same reference number without repeating an overlapping description thereof, for the sake of brevity.

Figure 4:
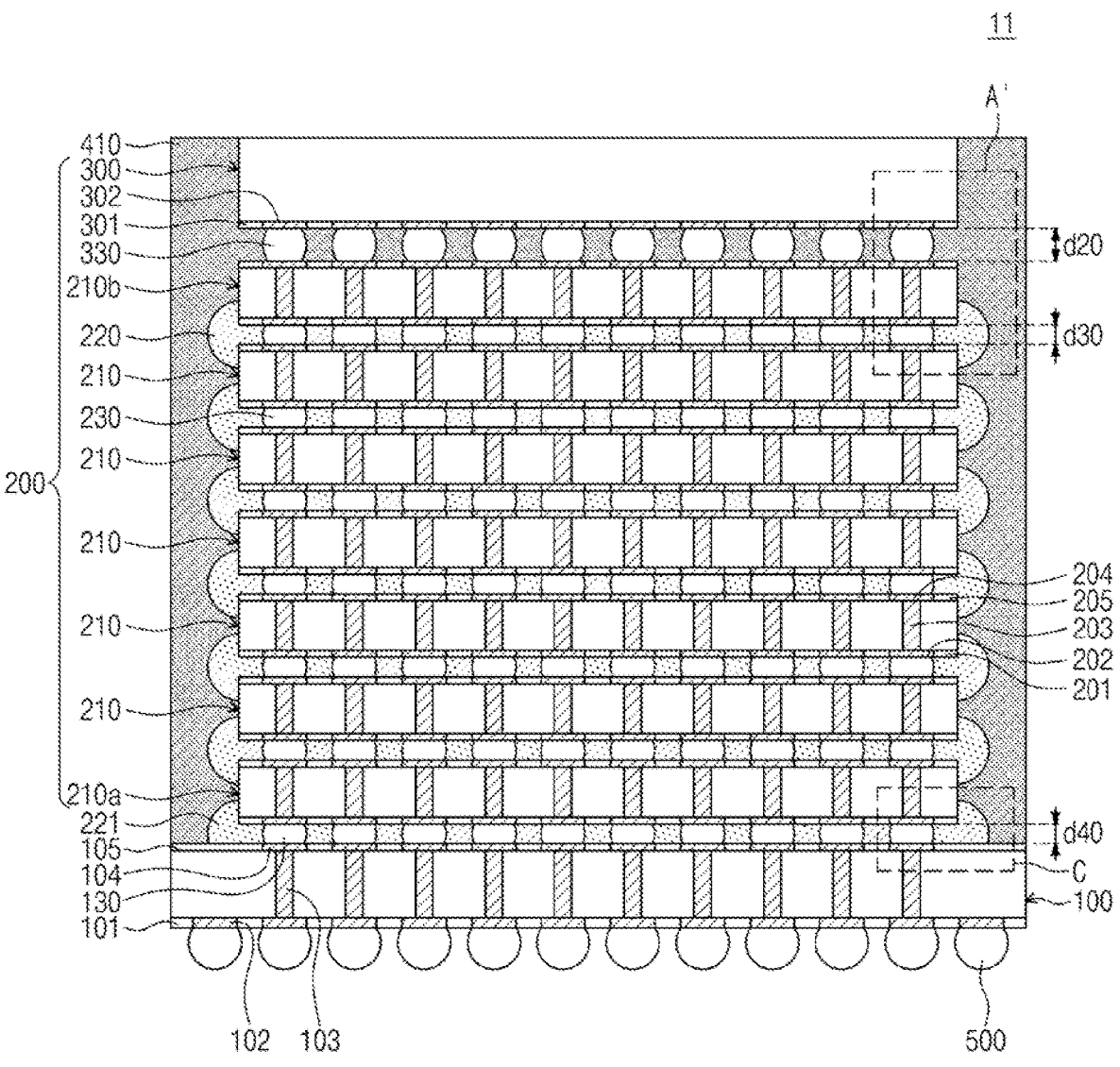
FIG. 4 is a sectional view illustrating a semiconductor package according to an embodiment.
Figure 5:
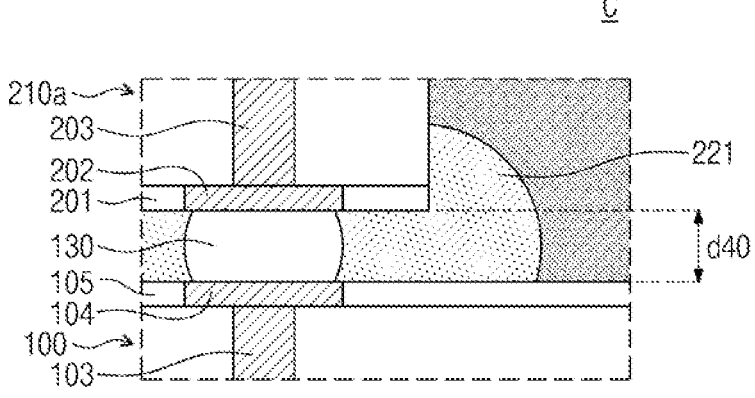
FIG. 5 is an enlarged sectional view illustrating a portion C of FIG. 4.

FIG. 4 is a sectional view illustrating a semiconductor package according to an embodiment of the disclosure. FIG. 5 is an enlarged sectional view illustrating a portion C of FIG. 4. A portion A' of FIG. 4 may have the same or similar structure as the portion A of FIG. 2.

Referring to FIGS. 2, 4, and 5, a chip stack package 11 may include the first semiconductor chip 100, the chip stack 200, a mold layer 410, and the substrate connection terminals 500.

The chip stack 200 may be disposed on the first semiconductor chip 100. The chip stack 200 may include the second semiconductor chips 210, which are vertically stacked, the third semiconductor chip 300 on the second semiconductor chips 210, and the non-conductive layers 220 between the second semiconductor chips 210. The mold layer 410 may be provided on the first semiconductor chip 100 to enclose the chip stack 200.

Unlike the embodiment of FIGS. 1 and 3, a region between the first semiconductor chip 100 and the chip stack 200 may be filled with a lower non-conductive layer 221. The lower non-conductive layer 221 may enclose the first connection terminals 130 provided between the first semiconductor chip 100 and the lowermost second semiconductor chip 210a. The lower non-conductive layer 221 may include a protruding portion that is extended to a region on a side surface of the lowermost second semiconductor chip 210a in a lateral direction. The lower non-conductive layer 221 may be in contact with the first semiconductor chip 100 and the lowermost second semiconductor chip 210a and may be spaced apart from the third semiconductor chip 300. The lower non-conductive layer 221 may cover a portion of the top surface of the first semiconductor chip 100. The lower non-conductive layer 221 may be enclosed by the mold layer 410. Although the mold layer 410 is illustrated to be provided between the two uppermost chips (e.g., semiconductor chips 210b and 300) of the stacked semiconductor chips 100, 210, and 300, the disclosure is not limited to this example. The mold layer 410 may be provided between three or more uppermost chips of the semiconductor chips 100, 210, and 300.

The first semiconductor chip 100 and the chip stack 200 may be spaced apart from each other by a fourth distance d40, which is substantially equal to the third distance d30. Here, the fourth distance d40 may be a distance between the first semiconductor chip 100 and the lowermost second semiconductor chip 210a. The fourth distance d40 may be smaller than the second distance d20. The fourth distance d40 may range from 5 μm to 20 μm.

Figure 6:
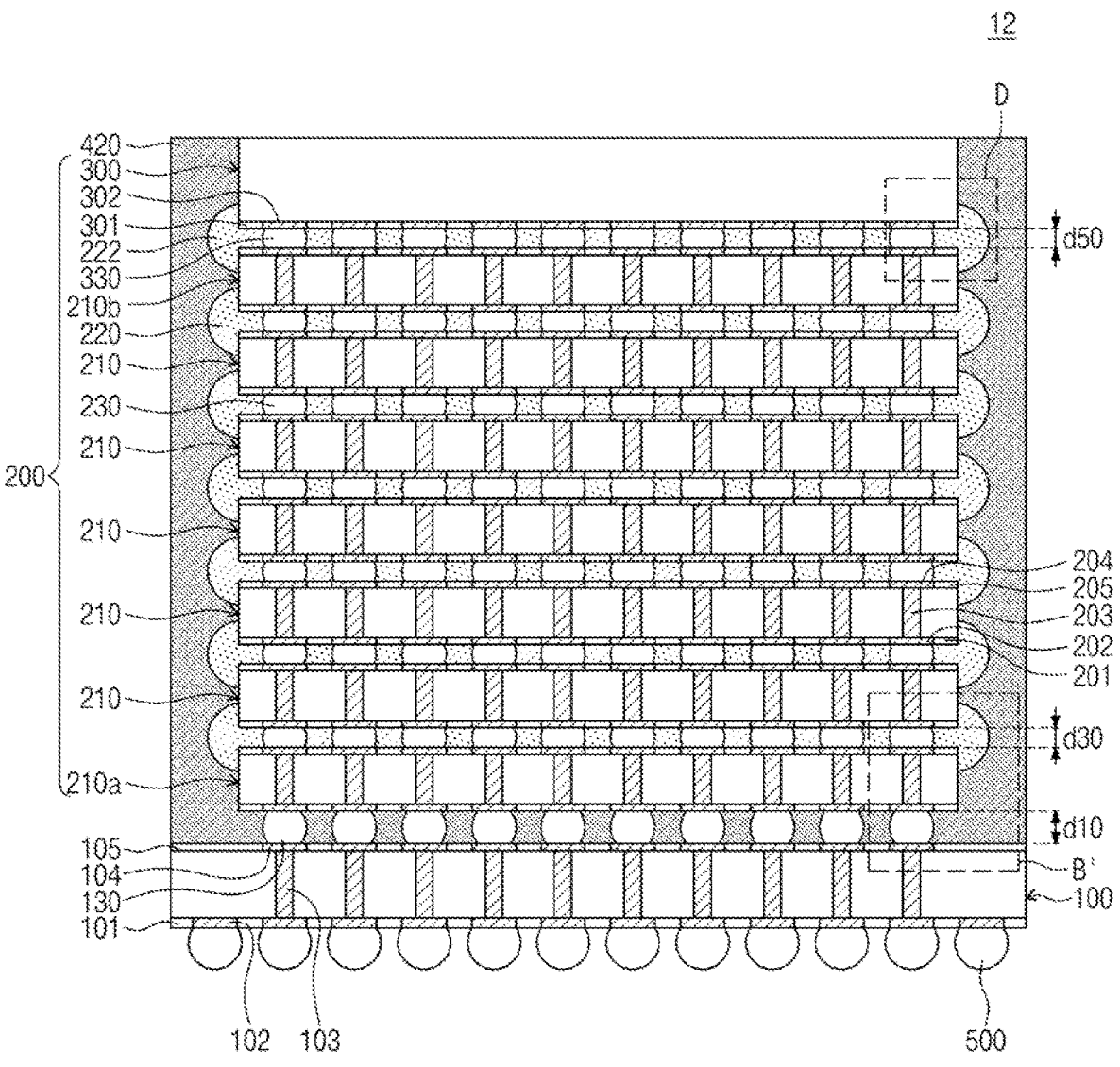
FIG. 6 is a sectional view illustrating a semiconductor package according to an embodiment.
Figure 7:
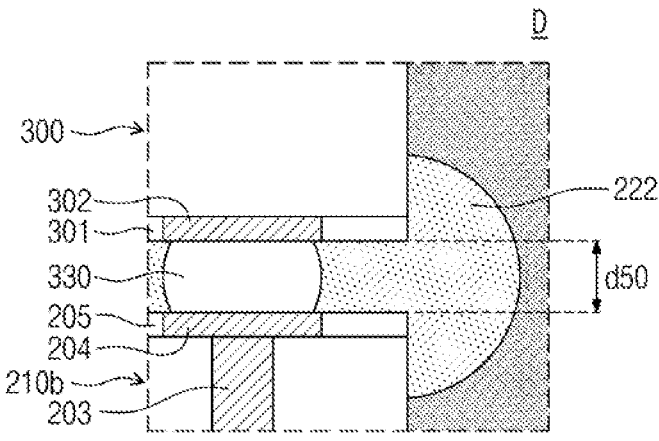
FIG. 7 is an enlarged sectional view illustrating a portion D of FIG. 6.

FIG. 6 is a sectional view illustrating a semiconductor package according to an embodiment of the disclosure. FIG. 7 is an enlarged sectional view illustrating a portion D of FIG. 6. A portion B' of FIG. 6 may have the same or similar structure as the portion B of FIG. 3.

Referring to FIGS. 3, 6, and 7, a chip stack package 12 may include the first semiconductor chip 100, the chip stack 200, a mold layer 420, and the substrate connection terminals 500.

The chip stack 200 may be disposed on the first semiconductor chip 100. The chip stack 200 may include the second semiconductor chips 210, which are vertically stacked, the third semiconductor chip 300 on the second semiconductor chips 210, and the non-conductive layers 220 between the second semiconductor chips 210. The mold layer 420 may enclose the chip stack 200, on the first semiconductor chip 100.

Unlike the embodiment of FIGS. 1 and 3, a region between the third semiconductor chip 300 and the uppermost second semiconductor chip 210b may be filled with an upper non-conductive layer 222. The upper non-conductive layer 222 may enclose the third connection terminals 330 provided between the third semiconductor chip 300 and the uppermost second semiconductor chip 210b. The upper non-conductive layer 222 may include a protruding portion that is extended to a region on the side surfaces of the third semiconductor chip 300 and to a region on the side surfaces of the uppermost second semiconductor chip 210b. The upper non-conductive layer 222 may cover a portion of the side surface of the third semiconductor chip 300 but may not be extended to a region on the top surface of the third semiconductor chip 300. The upper non-conductive layer 222 may be in contact with the uppermost second semiconductor chip 210$b$ and the third semiconductor chip 300 and may be spaced apart from the first semiconductor chip 100. Although the mold layer 420 is illustrated to be provided between the two lowermost chips (e.g., 210$a$ and 100) of the semiconductor chips 100, 210, and 300, the disclosure is not limited to this example. For example, the mold layer 420 may be provided between three or more lowermost chips of the semiconductor chips 100, 210, and 300.

The third semiconductor chip 300 and the uppermost second semiconductor chip 210$b$ may be spaced apart from each other by a fifth distance d50, and here, the fifth distance d50 may be substantially equal to the third distance d30. The fifth distance d50 may be smaller than the first distance d10. The fifth distance d50 may range from 5 μm to 20 μm.

Figure 8:
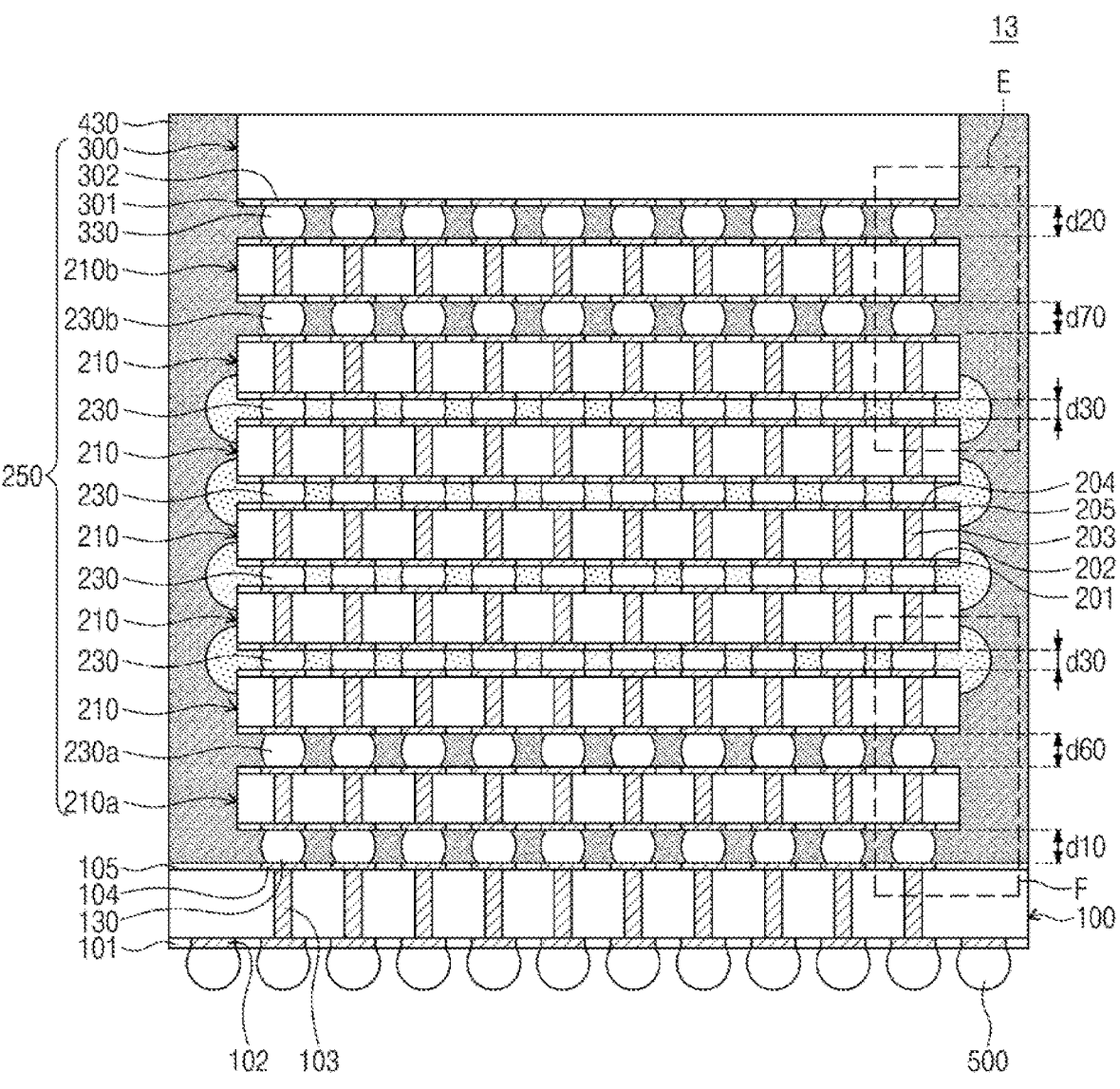
FIG. 8 is a sectional view illustrating a semiconductor package according to an embodiment.
Figure 9:
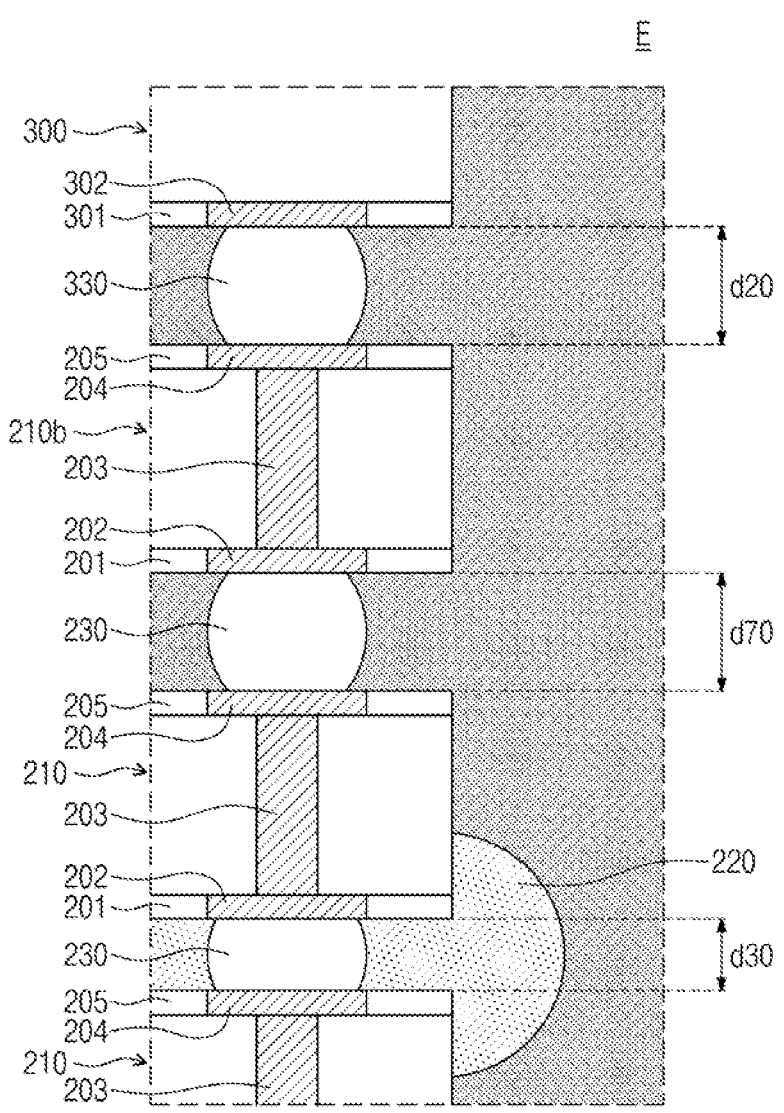
FIG. 9 is an enlarged sectional view illustrating a portion E of FIG. 8.
Figure 10:
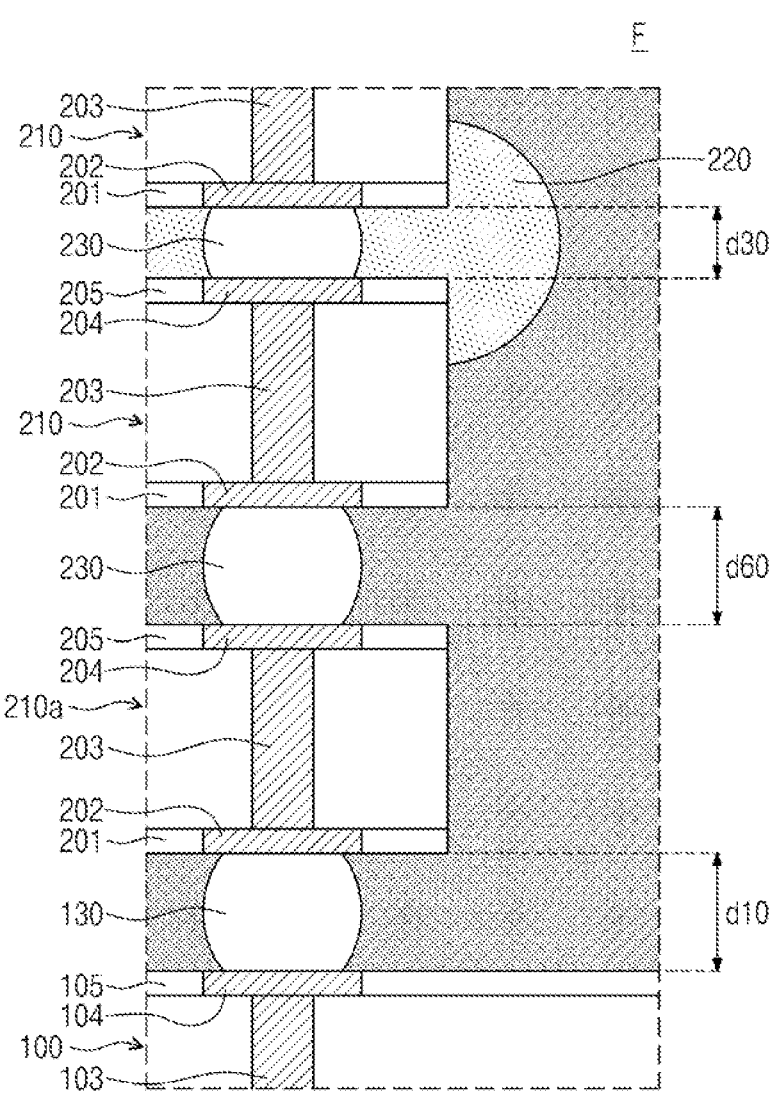
FIG. 10 is an enlarged sectional view illustrating a portion F of FIG. 8.

FIG. 8 is a sectional view illustrating a semiconductor package according to an embodiment of the disclosure. FIG. 9 is an enlarged sectional view illustrating a portion E of FIG. 8. FIG. 10 is an enlarged sectional view illustrating a portion F of FIG. 8.

Referring to FIGS. 8 to 10, a chip stack package 13 may include the first semiconductor chip 100, a chip stack 250, a mold layer 430, and the substrate connection terminals 500.

The chip stack 250 may be disposed on the first semiconductor chip 100. The chip stack 250 may include the second semiconductor chips 210, which are vertically stacked, the third semiconductor chip 300 on the second semiconductor chips 210, and the non-conductive layers 220 between the second semiconductor chips 210. The mold layer 430 may enclose the chip stack 250, on the first semiconductor chip 100.

The lowermost second semiconductor chip 210$a$ of the chip stack 250 may be enclosed by the mold layer 430. The mold layer 430 may be provided to fill a space between the lowermost second semiconductor chip 210$a$ and the first semiconductor chip 100 and to enclose side surfaces of the first connection terminals 130. The mold layer 430 may fill a region between the lowermost second semiconductor chip 210$a$ and the second semiconductor chip 210 adjacent thereto (e.g., the second semiconductor chip 210 immediately above the lowermost second semiconductor chip 210$a$). The mold layer 430 may enclose side surfaces of the second connection terminals 230$a$, which are disposed between the lowermost second semiconductor chip 210$a$ and the second semiconductor chip 210 adjacent thereto. The first semiconductor chip 100 and the lowermost second semiconductor chip 210$a$ may be spaced apart from the non-conductive layers 220.

A sixth distance d60 between the lowermost second semiconductor chip 210$a$ of the chip stack 250 and the second semiconductor chip 210 adjacent thereto may be substantially equal to the first distance d10. The sixth distance d60 may be larger than the third distance d30. The sixth distance d60 may range from 10 μm to 50 μm.

The uppermost second semiconductor chip 210$b$ of the second semiconductor chips 210 of the chip stack 250 may be enclosed by the mold layer 430. The mold layer 430 may fill a region between the uppermost second semiconductor chip 210$b$ and the third semiconductor chip 300 and may enclose side surfaces of the third connection terminals 330. The mold layer 430 may fill a region between the uppermost second semiconductor chip 210$b$ and the second semiconductor chip 210 adjacent thereto (e.g., the second semiconductor chip 210 immediately below the uppermost second semiconductor chip 210$b$). The mold layer 430 may enclose side surfaces of the second connection terminals 230$b$, which are disposed between the uppermost second semiconductor chip 210$b$ and the second semiconductor chip 210 adjacent thereto. The third semiconductor chip 300 and the uppermost second semiconductor chip 210$b$ may be spaced apart from the non-conductive layers 220.

A seventh distance d70 between the uppermost second semiconductor chip 210$b$ of the chip stack 250 and the second semiconductor chip 210 adjacent thereto may be substantially equal to the second distance d20. The seventh distance d70 may be larger than the third distance d30. The seventh distance d70 may range from 10 μm to 50 μm.

Figure 11:
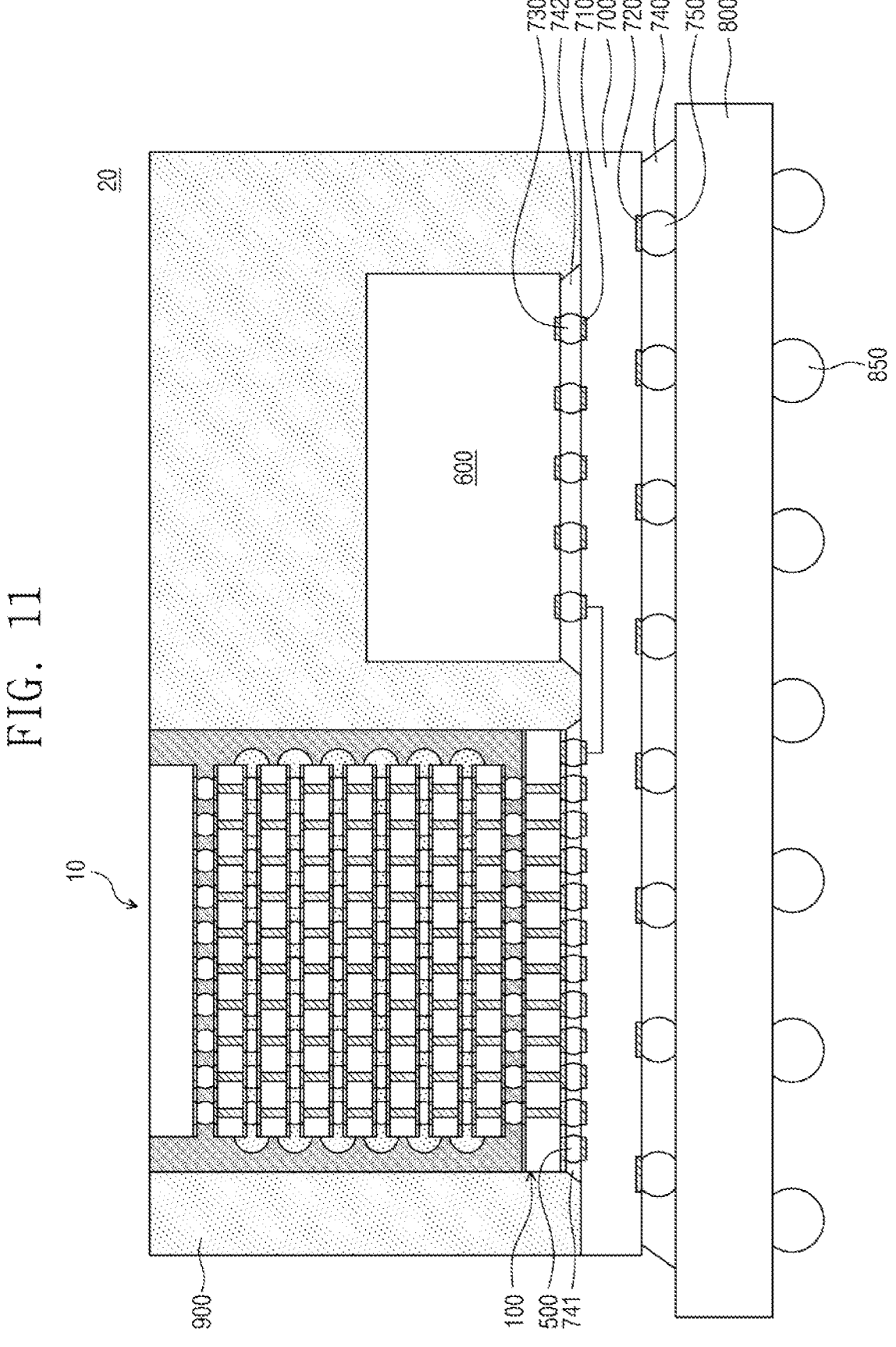

FIG. 11 is a sectional view illustrating a semiconductor package according to an embodiment of the disclosure.

Referring to FIG. 11, a semiconductor package 20 may include an interposer substrate 700, interposer terminals 750, a package substrate 800, an outer mold layer 900, outer connection terminals 850, the chip stack package 10, and a semiconductor device 600.

The package substrate 800 may be provided. The package substrate 800 may be a printed circuit board (PCB). The package substrate 800 may include an insulating base layer, substrate pads, and internal lines provided therein.

The outer connection terminals 850 may be disposed on a bottom surface of the package substrate 800. External electrical signals may be transmitted to the package substrate 800 by way of the outer connection terminals 850. The outer connection terminals 850 may include solder balls or solder bumps. The semiconductor package 20 may be provided to have a ball-grid array (BGA) structure, a fine ball-grid array (FBGA) structure, or a land grid array (LGA) structure, depending on the kinds and arrangement of the outer connection terminals 850.

The interposer substrate 700 may be disposed on the package substrate 800. The interposer substrate 700 may include first substrate pads 710, which are exposed to the outside of the interposer substrate 700 near a top surface of the interposer substrate 700, and second substrate pads 720, which are exposed to the outside of the interposer substrate 700 near a bottom surface of the interposer substrate 700. The interposer substrate 700 may be configured to provide a redistribution structure for the chip stack package 10 and the semiconductor device 600. The interposer substrate 700 may be flip-chip mounted on the package substrate 800. For example, the interposer substrate 700 may be mounted on the package substrate 800 by way of the interposer terminals 750, which are provided on the second substrate pads 720. The interposer terminals 750 may include solder balls or solder bumps. A first under-fill layer 740 enclosing the interposer terminals 750 may be provided between the package substrate 800 and the interposer substrate 700.

The chip stack package 10 may be provided on the interposer substrate 700. The chip stack package 10 may be mounted on the interposer substrate 700. For example, the chip stack package 10 may be coupled to the first substrate pads 710 of the interposer substrate 700 by way of the substrate connection terminals 500, which are provided on the bottom surface of the first semiconductor chip 100. A second under-fill layer 741 may be provided between the chip stack package 10 and the interposer substrate 700. The second under-fill layer 741 may be provided to fill a space between the interposer substrate 700 and the first semiconductor chip 100 and to enclose the substrate connection terminals 500. Although the chip stack package 10 is illustrated to be disposed on the interposer substrate 700, the disclosure is not limited to this example. The chip stack package on the interposer substrate 700 may have the same or similar structure as the chip stack package according to an embodiment described with reference to FIGS. 4, 6, and 8.

The semiconductor device 600 may be disposed on the interposer substrate 700. The semiconductor device 600 may be spaced apart from the chip stack package 10. A thickness of the semiconductor device 600 may be larger than the thickness of each of the semiconductor chips in the chip stack package 10. Connection bumps 730 may be provided on a bottom surface of the semiconductor device 600. The semiconductor device 600 may be coupled to the first substrate pads 710 of the interposer substrate 700 by way of the connection bumps 730. A third under-fill layer 742 may be provided between the semiconductor device 600 and the interposer substrate 700. The third under-fill layer 742 may be provided to fill a space between the interposer substrate 700 and the semiconductor device 600 and to enclose connection bumps 730.

The semiconductor device 600 may include a logic chip. However, the semiconductor device 600 may include a logic chip, which is of a different kind from the first semiconductor chip 100. For example, the semiconductor device 600 may be an ASIC chip or an application processor (AP) chip. The ASIC chip may include an application specific integrated circuit (ASIC). In an embodiment, the semiconductor device 600 may include a central processing unit (CPU) or a graphic processing unit (GPU).

The outer mold layer 900 may be provided on the interposer substrate 700. The outer mold layer 900 may be provided to cover the top surface of the interposer substrate 700 and to enclose the chip stack package 10 and the semiconductor device 600. A top surface of the outer mold layer 900 may be coplanar with a top surface of the chip stack package 10. The outer mold layer 900 may be formed of or include an insulating material. For example, the outer mold layer 900 may include an epoxy molding compound (EMC).

Figure 12:
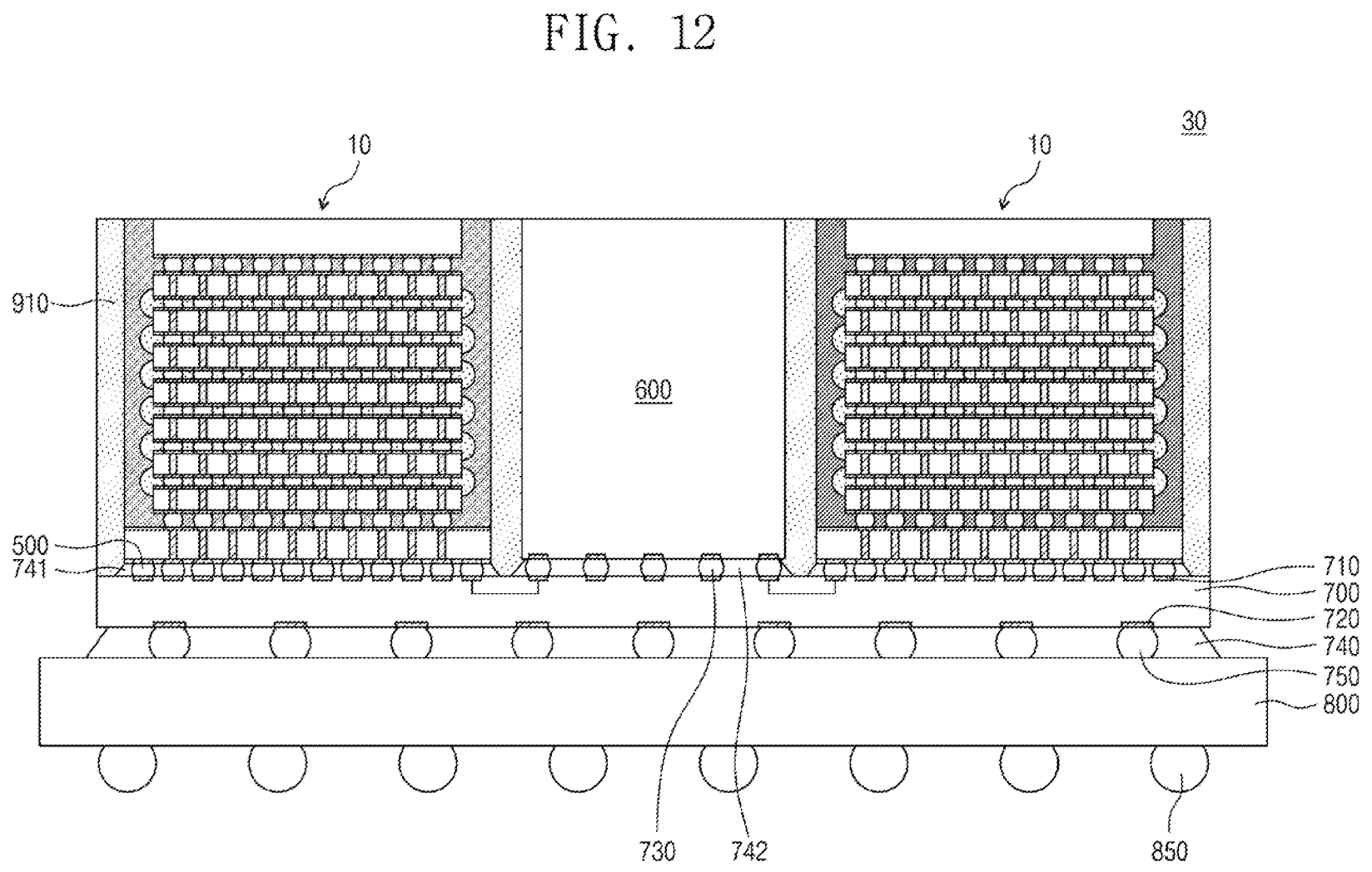

FIG. 12 is a sectional view illustrating a semiconductor package according to an embodiment of the disclosure. In the following description, an element previously described with reference to FIG. 10 may be identified by the same reference number without repeating an overlapping description thereof, for the sake of brevity.

Referring to FIG. 12, a semiconductor package 30 may include the interposer substrate 700, the interposer terminals 750, the package substrate 800, an outer mold layer 910, the outer connection terminals 850, the chip stack package 10, and the semiconductor device 600.

The chip stack packages 10 may be disposed on the interposer substrate 700. The chip stack packages 10 may be laterally spaced apart from each other. The semiconductor device 600 may be disposed between the chip stack packages 10. The semiconductor device 600 may be laterally spaced apart from the chip stack packages 10. The outer mold layer 910 may be provided on the top surface of the interposer substrate 700 to enclose the chip stack packages 10 and the semiconductor device 600. A top surface of the outer mold layer 910 may be coplanar with the top surfaces of the chip stack packages 10. Unlike the illustrated structure, the number of the chip stack packages 10 may be variously changed.

A semiconductor package according to an embodiment of the disclosure may include a plurality of semiconductor chips, which are vertically stacked, and a mold layer may be provided to fill regions between lower and intermediate ones of the semiconductor chips and between intermediate and upper ones of the semiconductor chips. Since the mold layer is provided between some of the semiconductor chips constituting the semiconductor package, it may be possible to prevent a failure, which is caused by a non-conductive layer, and to reduce a warpage issue in the semiconductor package. Accordingly, it may be possible to provide a semiconductor package with improved structural stability.

While example embodiments of the disclosure have been particularly shown and described, it will be understood by one of ordinary skill in the art that variations in form and detail may be made therein without departing from the spirit and scope of the attached claims.

What is claimed is:

1. A semiconductor package, comprising:
a first semiconductor chip;
a chip stack on the first semiconductor chip; and
a mold layer enclosing the chip stack, on the first semiconductor chip,
wherein the chip stack comprises:
second semiconductor chips vertically stacked on the first semiconductor chip;
a third semiconductor chip on the second semiconductor chips; and
non-conductive layers filling spaces between adjacent ones of the second semiconductor chips,
wherein the mold layer fills a space between the first semiconductor chip and the chip stack, and the mold layer fills a space between an uppermost one of the second semiconductor chips and the third semiconductor chip,
wherein the first semiconductor chip and the chip stack are spaced apart from each other by a first distance,
wherein the uppermost one of the second semiconductor chips and the third semiconductor chip are spaced apart from each other by a second distance, and
wherein the second semiconductor chips are spaced apart from each other by a third distance that is smaller than the first distance and the second distance.

2. The semiconductor package of claim 1, wherein the non-conductive layers comprise a material different from a material of the mold layer.

3. The semiconductor package of claim 1, wherein each of the non-conductive layers comprises a protruding portion which is extended to a region on a side surface of an adjacent second semiconductor chip of the second semiconductor chips, and
wherein each of the non-conductive layers is spaced apart from at least one of the first semiconductor chip and the third semiconductor chip.

4. The semiconductor package of claim 1, wherein each of the non-conductive layers covers at least a portion of a side surface of an adjacent second semiconductor chip of the second semiconductor chips.

5. The semiconductor package of claim 1, wherein the first distance and the second distance are each in a range from 10 μm to 50 μm, and
wherein the third distance is in a range from 5 μm to 20 μm.

6. The semiconductor package of claim 1, wherein the first semiconductor chip comprises a logic chip, and
wherein the second semiconductor chips and the third semiconductor chip comprise memory chips.

7. The semiconductor package of claim 1, wherein the mold layer covers a side surface of the third semiconductor chip and exposes a top surface of the third semiconductor chip.

8. The semiconductor package of claim 1, further comprising connection terminals between adjacent ones of the first semiconductor chip, the second semiconductor chips, and the third semiconductor chip, wherein each of the first semiconductor chip and the second semiconductor chips comprises penetration electrodes penetrating the first semiconductor chip and the second semiconductor chips, and wherein the first semiconductor chip, the second semiconductor chips, and the third semiconductor chip are electrically connected to each other by way of the connection terminals and the penetration electrodes.

9. The semiconductor package of claim 1, further comprising:

a substrate on which the first semiconductor chip is mounted;

outer connection terminals provided on a bottom surface of the substrate; and a semiconductor device on the substrate, wherein the semiconductor device is horizontally spaced apart from the first semiconductor chip.

10. A semiconductor package, comprising:

a semiconductor substrate;

substrate connection terminals on a bottom surface of the semiconductor substrate;

lower semiconductor chips vertically stacked on the semiconductor substrate;

non-conductive layers filling spaces between adjacent ones of the lower semiconductor chips;

an upper semiconductor chip on the lower semiconductor chips; and a mold layer enclosing the lower semiconductor chips, the non-conductive layers, and the upper semiconductor chip, on the semiconductor substrate, wherein the mold layer fills a space between the upper semiconductor chip and an uppermost one of the lower semiconductor chips, wherein each of the non-conductive layers protrudes to a region on a side surface of an adjacent lower semiconductor chip of the lower semiconductor chips and is spaced apart from the upper semiconductor chip, and wherein the non-conductive layers comprise a material different from a material of the mold layer.

11. The semiconductor package of claim 10, wherein the uppermost one of the lower semiconductor chips is spaced apart from the upper semiconductor chip by a first distance, and wherein the lower semiconductor chips are spaced apart from each other by a second distance that is smaller than the first distance.

12. The semiconductor package of claim 11, wherein the first distance is in a range from 10 μm to 50 μm, and the second distance is in a range from 5 μm to 20 μm.

13. The semiconductor package of claim 10, wherein the mold layer covers a side surface of the upper semiconductor chip and exposes a top surface of the upper semiconductor chip.

14. The semiconductor package of claim 10, wherein the mold layer fills a space between the semiconductor substrate and a lowermost one of the lower semiconductor chips.

15. The semiconductor package of claim 10, wherein each of the non-conductive layers covers at least a portion of the side surface of the adjacent lower semiconductor chip of the lower semiconductor chips.

16. The semiconductor package of claim 10, further comprising connection terminals between adjacent ones of the semiconductor substrate, the upper semiconductor chip, and the lower semiconductor chips, wherein each of the semiconductor substrate and the lower semiconductor chips comprises penetration electrodes penetrating the semiconductor substrate and the lower semiconductor chips, and wherein the semiconductor substrate, the upper semiconductor chip, and the lower semiconductor chips are electrically connected to each other by way of the connection terminals and the penetration electrodes.

17. The semiconductor package of claim 10, wherein the semiconductor substrate comprises a logic chip, and wherein the upper semiconductor chip and the lower semiconductor chips comprise memory chips.

18. A semiconductor package, comprising:

a first semiconductor chip;

substrate connection terminals on a bottom surface of the first semiconductor chip;

second semiconductor chips stacked on the first semiconductor chip;

non-conductive layers between adjacent ones of the second semiconductor chips;

a third semiconductor chip on the second semiconductor chips;

connection terminals between adjacent ones of the first semiconductor chip, the second semiconductor chips, and the third semiconductor chip;

penetration electrodes penetrating each of the first semiconductor chip and the second semiconductor chips and coupled to the connection terminals; and a mold layer enclosing the second semiconductor chips, the third semiconductor chip, and the non-conductive layers, on the first semiconductor chip, wherein the mold layer fills a space between the first semiconductor chip and a lowermost one of the second semiconductor chips and a space between the third semiconductor chip and an uppermost one of the second semiconductor chips, wherein each of the non-conductive layers comprises a protruding portion that is extended to a region on a side surface of an adjacent second semiconductor chip of the second semiconductor chips, and wherein each of the non-conductive layers is spaced apart from at least one of the first semiconductor chip and the third semiconductor chip.

19. The semiconductor package of claim 18, wherein the non-conductive layers comprise a material different from a material of the mold layer.

20. The semiconductor package of claim 18, wherein the first semiconductor chip is spaced apart from the lowermost one of the second semiconductor chips by a first distance, wherein the third semiconductor chip is spaced apart from the uppermost one of the second semiconductor chips by a second distance, and wherein the second semiconductor chips are spaced apart from each other by a third distance that is smaller than the first distance and the second distance.

* * * * *